United States Patent
Hähnel et al.

(10) Patent No.: US 10,662,350 B2
(45) Date of Patent: May 26, 2020

(54) PLASMA TREATMENT FOR MULTILAYER ADHESIVE BONDING ELEMENT

(71) Applicant: TESA SE, Norderstedt (DE)

(72) Inventors: Marcel Hähnel, Klein Nordende (DE); Jennifer Kipke, Hamburg (DE); CHristoph Nagel, Hamburg (DE); Jannik Sellin, Hamburg (DE)

(73) Assignee: TESA SE, Norderstedt (DE)

( * ) Notice: Subject to any disclaimer, the term of this patent is extended or adjusted under 35 U.S.C. 154(b) by 0 days.

(21) Appl. No.: 15/783,527

(22) Filed: Oct. 13, 2017

(65) Prior Publication Data
US 2018/0112107 A1 Apr. 26, 2018

(30) Foreign Application Priority Data

Oct. 21, 2016 (DE) .................. 10 2016 220 687

(51) Int. Cl.
*C09J 5/00* (2006.01)
*H02K 3/30* (2006.01)
(Continued)

(52) U.S. Cl.
CPC ............. *C09J 5/00* (2013.01); *B28B 19/003* (2013.01); *B32B 7/12* (2013.01); *B32B 37/26* (2013.01);
(Continued)

(58) Field of Classification Search
CPC ......... B29C 59/14; B29C 33/64; B29C 65/76; B32B 37/26; B32B 38/0008; B32B 7/12;
(Continued)

(56) References Cited

U.S. PATENT DOCUMENTS 3,503,782 A   3/1970   Ayres
3,850,786 A   11/1974  Jeffries et al.
(Continued)

FOREIGN PATENT DOCUMENTS

CN   1438381 A   8/2003
CN   1729237 A   2/2006
(Continued)

OTHER PUBLICATIONS

Wagner et al. "The Barrier Discharge: Basic Properties and Applications to Surface Treatment",—Vacuum, vol. 71, pp. 417-436, 2003.
(Continued)

*Primary Examiner* — Camie S Thompson
(74) *Attorney, Agent, or Firm* — Norris McLaughlin, P.A.

(57) ABSTRACT

Method for bonding by wrapping a medium which is capable of expanding transversely to a winding with an adhesive tape, in which:
an adhesive tape is unrolled from an adhesive tape roll,
the unrolled adhesive tape is provided on one side of a carrier film (1) with an adhesive cement layer (2) and on an opposite side with a separating agent layer (3),
the separating agent layer (3) is subjected to a plasma treatment,
the plasma-treated adhesive tape is wound around the medium which is capable of expanding transversely to a winding, so that at least a portion of the adhesive tape is bonded to a lower winding ply by the adhesive cement layer (2).

6 Claims, 3 Drawing Sheets

(51) Int. Cl.
| | |
|---|---|
| *B32B 7/12* | (2006.01) |
| *B28B 19/00* | (2006.01) |
| *B32B 37/26* | (2006.01) |
| *H01M 2/02* | (2006.01) |
| *C09J 7/20* | (2018.01) |
| *C23C 14/00* | (2006.01) |
| *C23C 16/00* | (2006.01) |
| *B32B 38/00* | (2006.01) |
| *C09J 5/02* | (2006.01) |
| *H01B 7/02* | (2006.01) |
| *H02K 3/40* | (2006.01) |
| *C09J 7/25* | (2018.01) |
| *C09J 133/10* | (2006.01) |
| *C09J 153/02* | (2006.01) |
| *C09J 183/00* | (2006.01) |
| *C08K 7/02* | (2006.01) |

(52) U.S. Cl.
CPC ............ *B32B 38/0008* (2013.01); *C09J 5/02* (2013.01); *C09J 7/201* (2018.01); *C09J 7/255* (2018.01); *C09J 133/10* (2013.01); *C09J 153/02* (2013.01); *C09J 183/00* (2013.01); *C23C 14/00* (2013.01); *C23C 16/00* (2013.01); *H01B 7/0241* (2013.01); *H01M 2/02* (2013.01); *H02K 3/30* (2013.01); *H02K 3/40* (2013.01); *C08K 7/02* (2013.01); *C09J 2201/606* (2013.01); *C09J 2203/302* (2013.01); *C09J 2205/102* (2013.01); *C09J 2205/106* (2013.01); *C09J 2205/31* (2013.01); *C09J 2433/00* (2013.01); *C09J 2453/00* (2013.01); *C09J 2467/006* (2013.01); *C09J 2483/00* (2013.01)

(58) Field of Classification Search
CPC ............ B32B 27/26; B32B 2205/102; B32B 2205/106; B32B 2205/31; B32B 2405/00; B32B 2310/04; C09J 183/00; C09J 2201/606; C09J 2205/31; C09J 2467/006; C09J 5/02; C09J 7/201; C09J 133/10; C09J 153/02; C09J 2203/302; C09J 2483/00; C09J 1/00; C09J 2205/106; C09J 7/20; H02K 3/30; H02K 3/40; A61F 13/58; A61F 2013/51066; B28B 19/003; H01M 2/02; H01B 7/0241; H01L 21/02315; H01L 21/67132; Y10T 428/1476; Y10T 428/31663
USPC ........ 604/389, 390; 156/157, 327, 338, 305; 428/337, 352, 41.8, 447; 427/535; 502/439

See application file for complete search history.

(56) References Cited

U.S. PATENT DOCUMENTS

| | | |
|---|---|---|
| 4,331,718 A | 5/1982 | Gleichechagen et al. |
| 4,414,275 A | 11/1983 | Woods |
| 4,675,582 A | 6/1987 | Hommes et al. |
| 5,061,535 A | 10/1991 | Kreckel et al. |
| 5,072,493 A | 12/1991 | Hommes et al. |
| 5,106,383 A * | 4/1992 | Mulder .................. A61F 13/58 604/389 |
| 6,432,528 B1 | 8/2002 | Faust et al. |
| 6,432,529 B1 | 8/2002 | Harder et al. |
| 6,541,707 B2 | 4/2003 | Külper et al. |
| 6,759,110 B1 | 7/2004 | Fleming et al. |
| 6,815,069 B2 | 11/2004 | Hohberg et al. |
| 8,048,514 B2 | 11/2011 | Müssig et al. |
| 8,176,959 B2 | 5/2012 | Lam |
| 8,394,478 B2 | 3/2013 | Ukei et al. |
| 9,725,622 B2 | 8/2017 | Korthals et al. |
| 10,183,476 B2 * | 1/2019 | Kipke ....................... B32B 1/00 |
| 2002/0029855 A1 | 3/2002 | Vasilakes et al. |
| 2002/0057300 A1 | 5/2002 | Baker et al. |
| 2002/0125037 A1 | 9/2002 | Kulper et al. |
| 2003/0176613 A1 | 9/2003 | Hohberg et al. |
| 2004/0265492 A1 | 12/2004 | Free et al. |
| 2005/0013958 A1 | 1/2005 | Callahan et al. |
| 2006/0127626 A1 | 6/2006 | Fleming et al. |
| 2006/0128921 A1 | 6/2006 | Cray et al. |
| 2006/0159856 A1 | 7/2006 | Kunz et al. |
| 2006/0228480 A1 | 10/2006 | Lin |
| 2009/0120574 A1 | 5/2009 | Husemann et al. |
| 2009/0123667 A1 | 5/2009 | Husemann et al. |
| 2009/0211791 A1 | 8/2009 | Tredwell et al. |
| 2010/0047518 A1 | 2/2010 | Husemann et al. |
| 2011/0020629 A1 | 1/2011 | Müssig et al. |
| 2011/0143134 A1 | 6/2011 | Emslander et al. |
| 2012/0111830 A1 | 5/2012 | Husemann et al. |
| 2012/0279755 A1 | 11/2012 | Korthals et al. |
| 2014/0014403 A1 | 1/2014 | Miller et al. |
| 2015/0044431 A1 | 2/2015 | Landa et al. |
| 2015/0144259 A1 | 5/2015 | Laulicht et al. |
| 2016/0347973 A1 | 12/2016 | Lange et al. |
| 2017/0306184 A1 | 10/2017 | Nakayama et al. |
| 2018/0111363 A1 | 4/2018 | Hähnel et al. |
| 2018/0112107 A1 | 4/2018 | Hähnel et al. |

FOREIGN PATENT DOCUMENTS

| | | | |
|---|---|---|---|
| CN | 101978013 A | 2/2011 | |
| CN | 102271917 A | 12/2011 | |
| CN | 102766414 A | 11/2012 | |
| CN | 105980502 A | 9/2016 | |
| DE | 28 45 541 A | 6/1980 | |
| DE | 198 07 752 A1 | 8/1999 | |
| DE | 100 11 788 A1 | 3/2002 | |
| DE | 10 2004 058 279 A1 | 6/2006 | |
| DE | 10 2004 058 281 A1 | 6/2006 | |
| DE | 10 2004 058 282 A1 | 6/2006 | |
| DE | 10 2006 053 440 A1 | 6/2008 | |
| DE | 10 2007 027 855 A1 | 12/2008 | |
| DE | 10 2008 037 223 A1 | 2/2010 | |
| DE | 10 2014 222 724 A1 | 5/2016 | |
| DE | 102014222724 * | 5/2016 | ............... C09J 7/40 |
| EP | 0 497 996 B1 | 4/1994 | |
| EP | 1 336 683 B1 | 6/2008 | |
| FR | 2 443 753 | 7/1980 | |
| JP | 2009-24042 | 2/2009 | |
| JP | 2012-233038 A | 11/2012 | |
| WO | 2010/078832 A1 | 7/2010 | |

OTHER PUBLICATIONS

German Office Action dated Jun. 29, 2017 corresponding to Application No. 10 2016 220 687.7.
Translation of Office Action dated Apr. 15, 2019 in connection with Korean Patent Application No. 10-2017-0135794.
Office Action dated Jul. 4, 2017, and issued in connection with German Patent Application No. 10 2016 220 691.5.
Office Action dated Dec. 30, 3019, and issued in connection with Chinese Patent Application No. 201710991228.5.
Translation of Office Action dated Jan. 11, 2019, in connection with Japanese Patent Application No. 2017-202424.

* cited by examiner

PLASMA TREATMENT FOR MULTILAYER ADHESIVE BONDING ELEMENT

This application claims priority of German Patent Application No. 10 2016 220 687.7, filed on Oct. 21, 2016, the entire contents of which is incorporated herein by reference.

The invention relates to a method for bonding by wrapping a medium which expands transversely to a winding with an adhesive tape. The invention further relates to a device with an adhesive tape that is wound onto itself and an applicator for applying the adhesive tape.

BACKGROUND OF THE INVENTION

A range of applications for adhesive tapes are known in which the adhesive tapes are wound onto themselves multiple times around a medium. For example, when manufacturing high-voltage batteries adhesive tapes are wound around themselves and bonded together in several layers. A force is applied to the winding structure not only by the preloading created during the act of winding itself, but also by an expansion process during battery charging and discharging processes. In some applications, the adhesive tapes may be reinforced with filaments. The filaments preferably extend in the lengthwise direction of the adhesive tape and increase the tensile strength of the adhesive tape considerably. However, in multiple winding situations the adhesion of the superimposed windings presents difficulties beyond the tensile strength of the adhesive tape. Normally, the adhesive tapes are supplied in the form of an adhesive tape roll before their application. To this end, the reverse sides of the adhesive tapes, that is to say the sides that face the adhesive cement layer on a carrier film, are furnished outwardly with a separating layer. The separating layer reduces the separating force between the carrier film and the adhesive cement layer of the following adhesive tape winding, and this is what makes it possible to unwind the adhesive tape from the adhesive tape roll in the first place. This renders the use of a liner unnecessary and reduces costs. The separating layer may be a silicone-containing layer, or also a release coating. The separating layer usually remains on the outside of the carrier film after the adhesive tape is unrolled and of course also reduces the separating forces between one winding of the adhesive tape and the following outer winding of adhesive tape when the tape is subsequently wound round the medium, for example a high-voltage battery. Particularly with media which expand transversely to the winding, such as high-voltage batteries, this can cause the windings of the wound adhesive tape to become detached because of the expansion forces generated.

It is therefore the object of the present invention to provide a method for bonding by wrapping media that expand transversely which avoids the drawbacks described previously.

It is a further object of the present invention to provide a device that has an adhesive tape which bonds with itself and avoids the drawbacks described previously.

It is a further object of the invention to provide an applicator with which the method according to the invention may be carried out.

In a first aspect thereof, the object is solved with a method as described in the introduction having the features of Claim 1.

SUMMARY OF THE INVENTION

The adhesive tape for use in the method according to the invention includes a carrier film which preferably extends over the full length and width of an adhesive tape. An adhesive cement layer is preferably provided over the full expanse of one side of the carrier film, and a separating agent layer is provided, also over the full expanse, on an opposite side of the carrier film.

The adhesive tape is presented in the form of an adhesive tape roll and is unwound from the adhesive tape roll for application. After the adhesive tape or a portion of the adhesive tape is unwound, the outside of the separating agent layer is subjected to a plasma treatment. The plasma-treated adhesive tape is then wound around the medium which expands transversely in such manner that at least a portion of the adhesive tape is bonded to the adhesive cement layer on a lower winding ply directly adjacent to it.

It is preferably also provided that the adhesive tape is wound around the medium which expands transversely to the winding in several winding plies which are bonded one on top of the other after the plasma treatment. According to the invention, the adhesive tape also adheres to itself, at least along a portion of a winding ply or along several winding plies.

DETAILED DESCRIPTION

Films such as PA, PU or PVC, polyolefins or polyester, preferably a polyester of PET (polyethylene terephthalate) are suitable for use as the carrier film. The film itself may in turn consist of a plurality of single plies, for example plies that have been co-extruded to create a film.

Polyolefins are used for preference, but copolymers of ethylene and polar monomers such as styrene, vinyl acetate, methyl methacrylate, butyl acrylate or acrylic acid are also included. It may be a homopolymer such as HDPE, LDPE, MDPE or a copolymer of ethylene or another olefin such as propene, butene, hexene or octene (LLDPE, VLLDE, for example). Polypropylenes (for example polypropylene homopolymers, polypropylene random copolymers or polypropylene block copolymers) are also suitable.

Monoaxially and biaxially stretched films lend themselves extremely well to use as films according to the invention. Monoaxially stretched polypropylene for example is characterized by very good tear strength and low longitudinal expansion.

Particularly preferred are polyester-based films, particularly those made from polyethylene terephthalate.

The film preferably has a thickness from 12 μm to 100 μm, more preferably from 28 μm to 50 μm, particularly 36 μm.

The film may be colored and/or transparent.

An adhesive cement layer is provided on one side of the carrier film, preferably covering it completely. All known adhesive cement systems may be used.

Besides natural or synthetic rubber-based adhesives, particularly silicone and polyacrylate adhesive cements are usable, preferably a low-molecular acrylate hot melt adhesive cement. The latter substances are described in greater detail in DE 198 07 752 A1 (U.S. Pat. No. 6,432,529) and DE 100 11 788 A1 (U.S. Pat. No. 6,541,707). Acrylate-based, UV-crosslinking adhesive cements are also suitable.

The coating weight is preferably in the range between 15 and 200 g/m$^2$, more preferably between 30 and 120 g/m$^2$, particularly preferably 50 g/m$^2$ (roughly corresponding to a thickness of 15 to 200 μm, more preferably 30 to 120 μm, particularly preferably 50 μm).

The adhesive cement is preferably a pressure-sensitive adhesive cement, that is to say a viscoelastic compound which is permanently tacky and remains capable of adhesion at room temperature in dry state. Adhesion takes place immediately and on almost all substrates with light pressure.

Pressure-sensitive adhesives based on polymer blocks containing polymer blocks are used. These are preferably produced from vinyl aromatics (A-blocks) such as styrene and those manufactured by polymerization of 1,3-dienes (B-blocks) such as butadiene and isoprene or a copolymer of the two. Mixtures of different block copolymers may also be used. Products that are partly or fully hydrogenated are preferred.

The block copolymers may have a linear A-B-A-structure. It is likewise possible to use block copolymers in radial form and star-shaped and linear multiblock copolymers.

Polymer blocks based on other aromatic-containing homo- and copolymers (preferably $C_8$- to $C_{12}$ aromatics) with glass transition temperatures>approx. 75° C., such as aromatic blocks containing α-methylstyrene, may also be used instead of the polystyrene blocks. Polymer blocks based on (meth)acrylate homopolymers and (meth)acrylate copolymers with glass transition temperatures>+75° C. are also usable. In this context, usable block copolymers include either those which use hard blocks based solely on (meth) acrylate polymers or those which use both polyaromatic blocks, polystyrene blocks for example, and poly(meth) acrylate blocks.

Unless stated otherwise in individual cases, the glass transition temperature characteristics for non-inorganic materials and materials that are not predominantly inorganic, particularly for organic and polymeric materials, refer to the glass transition temperature value Tg according to DIN 53765:1994-03 (see section 2.2.1).

According to the invention, block copolymers that use further polydiene-containing elastomer blocks and the hydrogenated products of such block copolymers, e.g. copolymers of a plurality of different 1,3-dienes, may also be used instead of styrene-butadiene block copolymers and styrene-isoprene block copolymers and/or the hydrogenated products thereof, and thus also styrene-ethylene/butylene block copolymers and styrene-ethylene/propylene block copolymers. Functionalized block copolymers such as maleic anhydride-modified or silane-modified styrene block copolymers are also usable according to the invention.

Typical application concentrations for the block copolymer are in a range between 30 wt % and 70 wt %, particularly in a range between 35 wt % and 55 wt %.

Other polymers which may be present and may replace up to half of the vinyl aromatic-containing block copolymers include polymers based on pure hydrocarbons, for example unsaturated polydienes such as natural or synthetic polyisoprene or polybutadiene, chemically essentially saturated elastomers such as saturated ethylene-propylene copolymers, α-olefin copolymers, polyisobutylene, butyl rubber, ethylene-propylene rubber and chemically functionalized hydrocarbons such as polyolefins that contain halogen, acrylate or vinyl ether.

Adhesive resins serve as tackifiers.

Suitable adhesive resins include preferably partially or completely hydrogenated resins based on rosin or rosin derivatives among others. At least partially hydrogenated hydrocarbon resins, for example hydrogenated hydrocarbon resins obtained by partial or complete hydrogenation of aromatic-containing hydrocarbon resins (for example Arkon P and Arkon M range manufactured by Arakawa or Regalite range by Eastman), hydrocarbon resins based on hydrogenated dicyclopentadiene polymers (for example Escorez 5300 range by Exxon), hydrocarbon resins based on hydrogenated C5/C9 resins (Escorez 5600 range by Exxon) or hydrocarbon resins based on hydrogenated C5 resins (Eastotac manufactured by Eastman) and/or mixtures thereof may also be used.

Polyterpene-based hydrogenated polyterpene resins are also usable. The aforementioned tackifying resins can be used either alone or in a mixture.

Light stabilizers such as UV absorbers, sterically hindered amines, antiozonants, metal deactivators, processing agents and terminal block reinforcing resins may typically be used as further additives.

Liquid resins, process oils or low-molecular liquid polymers, for example low-molecular polyisobutylenes with molecular weights<1500 g/mol (number average) or liquid EPDM types are typically used as plasticizers, for example.

The adhesive cement may be applied in the lengthwise direction of the adhesive tape in the form of a strip which is less wide than the adhesive tape carrier.

The coated strip may be 10 to 80% as wide as the carrier material. In such a case, the use of strips with a coating that is 20 to 50% as wide as the carrier material is particularly preferred.

Depending on the intended use, the carrier material may be coated with several parallel strips of the adhesive.

The position of the strip on the carrier is freely selectable, although it is preferably deposited directly on one of the edges of the carrier.

Finally, the adhesive tape may include a covering material, by which the one adhesive cement layer is covered until it is ready for use. All of the materials listed in detail above are suitable for use as covering materials.

However, a lint-free material is preferably used, for example a plastic film or a thoroughly glue-laminated, long-fibre paper.

The adhesive cements may be produced and processed from a solution, a dispersion or from a melt. Preferred production and processing methods are conducted from a solution and a melt. The adhesive cement is produced particularly preferably from a melt, wherein in particular batch methods or continuous methods may be used. Continuous production of the pressure-sensitive adhesives with the aid of an extruder is particularly advantageous.

Processing from a melt may involve application methods via a nozzle or a calender.

Known methods based on a solution include coatings with doctor blades, knives or nozzles to name but a few.

On the opposite side of the carrier film, that is to say the side that faces the adhesive cement layer, the carrier film is furnished with a separating agent layer. The separating agent layer preferably also covers the opposite side of the carrier film completely.

Separating agents, also called releasing agents, may have various forms. Suitable separating agents comprise surfactant release systems based on long-chain alkyl groups such as stearyl sulfosuccinates or stearyl sulfosuccinamates, and also polymers which may be selected from the group consisting of polyvinylstearyl carbamates, polyethylene iminestearyl carbamides, chromium complexes of $C_{14}$-$C_{28}$ fatty acids and stearyl copolymers such as are described in DE 28 45 541 A (U.S. Pat. No. 4,678,846) for example. Separating agents based on acrylic polymers with perfluorinated alkyl groups, silicones or fluorosilicone compounds, based on poly(dimethyl-)siloxanes for example, are also suitable. The release layer particularly preferably comprises a silicone-based polymer. Particularly preferred examples of such active silicone-based releasing polymers include polyurethane-modified and/or polyuric acid-modified silicones, preferably organopolysiloxane/polyuric acid/polyurethane block copolymers, particularly preferably such as described in example 19 of EP 1 336 683 B1 (U.S. Pat. No. 6,815,069), most particularly preferably anionically stabilized polyurethane-modified and polyuric acid-modified silicones with a weight proportion of silicone of 70% and an acid number of 30 mg KOH/g. The use of polyurethane-modified and/or polyuric acid-modified silicones ensures that the products according to the invention exhibit optimized separating behaviour together with optimized resistance to ageing and universal writing properties. In a preferred embodiment of the invention, the release layer comprises 10 to 20 wt %, particularly preferably 13 to 18 wt % of the active separating component.

The problem with known adhesive tapes is the fact that ideally the separating agent layer should reduce the separating forces between the adhesive cement layer and the carrier film, so that the adhesive tape can be wound onto itself for storage, and enable the adhesive to be unrolled again later. The unrolled adhesive tape still has a separating agent layer, so that when the adhesive tape is later wound around the medium with variable transverse dimension again, the separating forces between the adhesive cement layer and the carrier film below below it are weakened, this time disadvantageously, and the strength of the winding is reduced.

Surprisingly, however, it has been found that the separating forces can be increased to a unexpectedly high degree by applying a plasma treatment to the unwound adhesive tape after it has been unrolled, if the separating agent layer on the outside, that is to say on the side facing the carrier film, is treated with a plasma.

A corona treatment, which is a type of plasma treatment, is defined as a surface treatment generated by a high AC voltage between two electrodes with filamentary discharges, wherein the discrete discharge channels are incident on the surface to be treated, see also Wagner et al., Vacuum, 71 (2003), pages 417 to 436. Ambient air, carbon dioxide or nitrogen, inert gas or oxygen may be used as the process gas. Additional gas-phase substances from the group consisting of siloxane, acrylic acids or solvents or hydrogen, alkanes, alkenes, alkynes, silane, silcon-organic monomers, acrylate monomers, water, alcohols, peroxides and organic acids may also be added to the process gas.

The substrate is almost always placed in or passed through the discharge space between one electrode and a counterelectrode, this being defined as "direct" physical treatment. Weblike substrates are typically passed between an electrode and an earthed roller.

Particularly in the context of industrial applications, the term "corona" is usually understood to mean dielectric barrier discharge (DBD). In this context, at least one of the electrodes consists of a dielectric, that is to say an insulator, or is coated or covered with such a material. The second electrode is furnished with small radii or tips to generate the corona effect, the effect of large gradients in the electrical field. In this case, the substrate may also function as a dielectric.

The intensity of a corona treatment is expressed as the "dose" in [Wmin/m$^2$], wherein dose D=P/b*v, where P=electrical output [W], b=electrode width [m], and v=web speed [m/min].

The substrate is almost always placed in or passed through the discharge space between one electrode and a counterelectrode, this being defined as "direct" physical treatment.

Weblike substrates in this context are typically passed between an electrode and an earthed roller. Sometimes, the term "blown gas corona" or "one-sided corona" is also used.

A device for surface treatment by means of corona discharge is known from FR 2 443 753. In that device, both electrodes are arranged on the same side of the surface of the object that is to be treated, and the first electrodes consist of a plurality of points along which a curved arrangement of a second electrode is provided. An AC voltage of several kV with a frequency of 10 kHz is applied between the two electrodes. The corona discharge along the field lines then acts on the surface as it is transported past, polarizing the surface so that the adhesion properties of an adhesive cement are improved on the surface that is treated with the corona effect.

It is possible to treat materials of different natures, shapes and thicknesses with more even intensity by dispensing with the discharge filaments such as are used in corona discharges and selecting a dual pin electrode as described in EP 0 497 996 B1, wherein one channel each is present for applying pressure to the respective pin electrodes. A corona discharge is created between the two electrode tips and ionizes the gas flowing through the channels, converting it into a plasma. This plasma then reaches the surface to be treated in the form of remote or afterglow plasma via the gas flow, and there in particular causes a surface oxidation which improves the wettability of the surface. The nature of the physical treatment is defined (here) as indirect because the treatment is not carried out at the location where the electrical discharge takes place. The treatment of the surface takes place under atmospheric pressure, or approximately thereto, although the pressure in the electrical discharge space or gas channel can be increased. In this context, the plasma is understood to be an atmospheric pressure plasma which is an electrically activated homogeneous reactive gas which is not in thermal equilibrium at a pressure close to atmospheric pressure in the area of action. The gas is activated by the electrical discharges and the ionization processes in the electric field, and highly excited states are generated in the gas components. The gas and gas mixture used are referred to as the process gas. Air, carbon dioxide, inert gas, nitrogen or oxygen or mixtures thereof are preferably used as the process gas. In general, gas-phase substances such as siloxane, acrylic acids or solvents, or also other gas-phase substances such as siloxane, acrylic acids or hydrogen, alkanes, alkenes, alkynes, silanes, silicon-organic monomers, acrylate monomers, water, alcohols, peroxides and organic acids or other components may also be added to the process gas. Components of the atmospheric pressure plasma may be highly excited atomic states, highly excited molecular states, ions, electrons or unchanged components of the process gas. The atmospheric pressure plasma is not produced in a vacuum, but typically in an air environment. This means that even if the process gas itself is not air, the radiating plasma at least contains components of the ambient air.

In a corona discharge according to the preceding definition, the high voltage applied serves to form filamentary discharge channels with accelerated electrons and ions. The light electrons in particular strike the surface at high speed, with energies that are sufficient to break most molecular bonds. The reactivity of the reactive gas components which are also generated is largely a less important effect. The broken bond sites then continue to react with components in the air or in the process gas. A decisive effect is the formation of short-chain byproducts of decomposition by electron bombardment. In treatments of greater intensity, significant material erosion also takes place.

The reaction between a plasma and the substrate surface enhances the effect of direct "incorporation" of the plasma components. Alternatively, an excited state or an open bond site and radicals may be created on the surface, which then continue with a secondary reaction, with the oxygen in the ambient air, for example. With some gases, such as inert gases, a chemical bond between the atoms or molecules of the process gas and the substrate may be discounted. In this case, the activation of the substrate takes place exclusively via secondary reactions.

Accordingly, the essential difference is that with the plasma treatment there is no direct effect on the surface from discrete discharge channels. Thus, the effect takes place homogeneously and gently, and predominantly via reactive gas components. In an indirect plasma treatment, free electrons may be present but not accelerated, since the treatment is carried out outside the electrical field which is to be generated.

As a result of the combination of species, the plasma treatment is more uniform and less harsh than a corona treatment, because no discrete discharge channels are incident on the surface. Fewer short-chain byproducts of decomposition of the treated material which might form a layer impairing the surface are created. This is why better wettability characteristics can often be obtained after plasma treatment than after corona treatment, and the effect is retained for longer.

The object is further solved with an applicator according to the invention as described in claim 14.

The devices that generate plasma may be integrated in an applicator for applying the adhesive tape to the medium or substrate in both artisanal and industrial settings. Said applicators may be operated automatically, manually, or manually with technological support.

The applicator according to the invention comprises an adhesive tape roll and a device for unwinding an adhesive tape from the adhesive tape roll, wherein the adhesive tape unwound from the adhesive tape roll is furnished on one side of a carrier film with an adhesive cement layer and on an opposite side with a separating agent layer, and it includes a plasma nozzle, which is directed at the separating agent layer of the unwound adhesive tape.

The positions of the plasma nozzle and the device for unwinding, which is particularly a collecting pin for the adhesive tape roll and/or an area in which the unwound adhesive tape is transported past the plasma nozzle, are preferably fixed relative to each other, and constant, so that the separating agent layer undergoes uniform plasma treatment as it is unwound.

The applicator is advantageously equipped with a cutting device for the adhesive tape. With the cutting device, the unwound and bonded adhesive tape can be cut.

The applicator particularly preferably includes a suction device for reaction byproducts created during the plasma treatment, such as ozone or nitrogen oxides.

The applicator may also include a pinch roller for pressing the adhesive tape against the substrate.

Collecting devices may also be provided for any liners present.

The adhesive tape is guided through the applicator in such a way that a plasma treatment of the adhesive tape is possible with constant treatment parameters, such as the distance from the plasma source and treatment speed.

In a preferred embodiment of the invention, the adhesive tape includes at least one filament which extends in the lengthwise direction of the adhesive tape and thereby increases its tensile strength. In particular, such filaments may be glass filaments or PET filaments. The filaments may be integrated in the carrier film and/or in the adhesive cement layer. The filaments typically consist of a bundle of single filaments, wherein the bundle is formed by single filaments stuck together by sizing—i.e. with a bonding agent.

The filaments may be arranged lengthwise beside and at a distance from each other, or they may also be integrated in the carrier film or the adhesive cement layer or both as a scrim or woven.

The filament scrim or woven has a longitudinal tensile strength of preferably at least 100 N/cm, more preferably 200 N/cm, particularly preferably 500 N/cm.

The yarns for creating the scrim or woven preferably have a strength from 80 to 2200 dtex, more preferably 280 to 1100 dtex.

For the purposes of this invention, a filament is understood to be a bundle of straight, parallel single fibres/single filaments, which is also often referred to in the literature as a multifilament. Optionally, this fibre bundle may be stiffened by twisting it about itself, in which case the filaments are said to be spun or twined. Alternatively, the fibre bundle may be intrinsically stiffened by agitating with compressed air or a water jet. In the subsequent text, the general designation of filament will be used to refer to all of these embodiments.

The filament may be textured or smooth and may be spot-stiffened or not stiffened at all.

The scrim/woven may have been dyed subsequently or it may be made from spun dyed yarns.

The filaments consist more preferably of polyester, polypropylene, polyethylene or polyamide, most preferably polyester (Diolen).

The object of the invention is solved in the second aspect thereof with a device having the features of claim 8.

The term device is to be interpreted generally here. It comprises a medium whose size is variable transversely to the winding, for example transformers, packaging, steel bundles, batteries and high-voltage batteries. The media are preferably changeable in size transversely to the winding, preferably under the effects of temperature. An adhesive tape that is wound onto itself is provided around the medium transversely to the winding, which tape encircles the medium, lying flush against it, and is bonded thereto.

The device includes an adhesive tape which is wound onto itself with a carrier film, on one side of which an adhesive cement layer is applied, and on the other side of which an outwardly plasma-treated separating agent layer is applied. The adhesive tape is provided in particular for winding around media which are capable of expanding transversely to the winding, such as high-voltage batteries, for example. The device is manufactured in particular for the purposes of the adhesive tape and preferably by one of the aforementioned methods.

The invention will be described with reference to an exemplary embodiment in a drawing.

The invention relates to a method for winding multiple times around media that expand transversely to the winding. An example of such a use is the manufacture of high-voltage batteries, in which the adhesive tape is bonded to itself in multiple plies. A force is exerted on the wound adhesive tape by the preloading created during the act of winding itself, but also by expansion processes while the batteries are charging and discharging. In order to be able to sustain the tensile forces acting on the adhesive tape during the expansion of the battery, the adhesive tape is reinforced with one or more filaments extending lengthwise.

Figure 2:
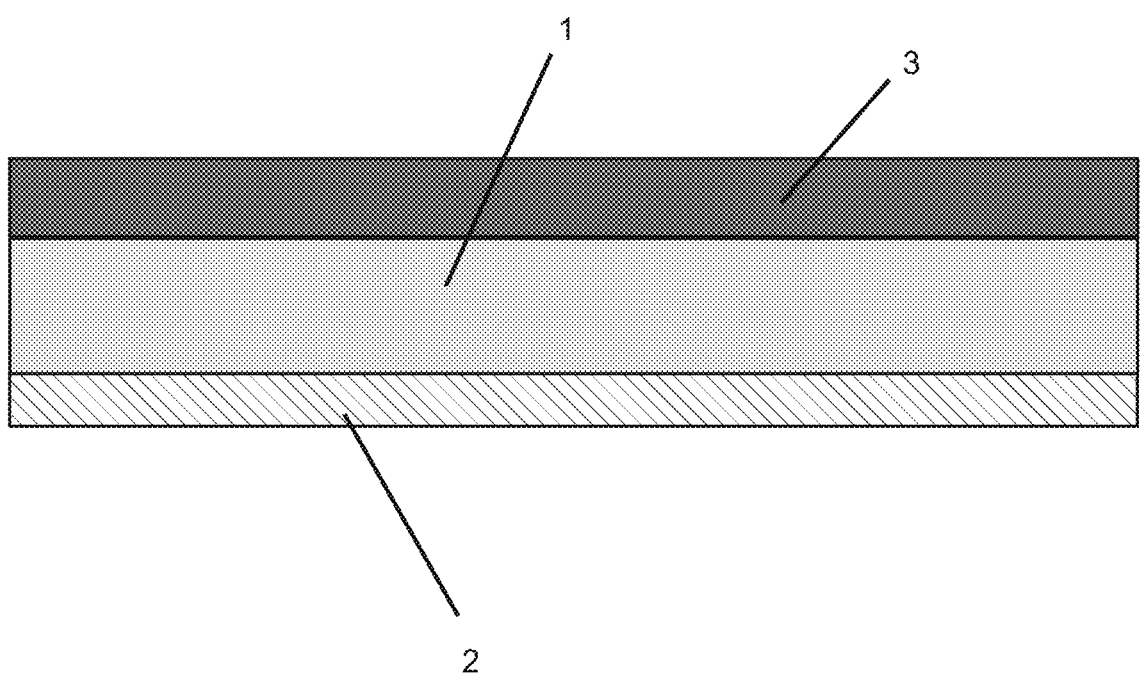
FIG. 2 shows an exemplary structure of an adhesive tape according to the invention.

As illustrated in FIG. 2, the adhesive tape according to the invention includes a carrier film 1 and an adhesive cement layer 2 on one side of carrier film 1 and a separating agent layer 3 on the opposite side. An acrylate adhesive cement is used as a pressure-sensitive adhesive. In this case, silicone is used as the separating agent. One of the properties of the silicone is that it reduces the separating forces between the adhesive cement layer 2 and the carrier film 1 between adjacent plies on an adhesive tape wound up on a roll, so that the adhesive tape between the adhesive cement layer 2 of the upper ply and the carrier film 1 of the ply immediately adjacent to it can be pulled off and reapplied easily. The separating agent remains on the carrier film 1 as separating agent layer 3, so that when the adhesive tape is applied again when it is wound around high-voltage batteries, the separating forces between adjacent plies of the adhesive tape are reduced, in this case undesirably.

Figure 1:
FIG. 1 shows a schematic representation of a static shear test.

One possible way to test the bonding strength of the adhesive cement that has been applied to one side of the carrier film on the other side is to determine the shear strength of the adhesion on the other side. The method used to determine shear strength is a dynamic shear test as represented in FIG. 1. The test is carried out as follows. A strip of adhesive tape measuring 40×25 mm is stuck to the reverse side of a strip of adhesive tape measuring 40×25 mm over an area of 25×25 mm; the adhesion area is pressed with 100 N/cm$^2$ for one minute. The adhesive tape assemblage is attached to a tensile test machine by the protruding strip of adhesive tape; the sample is pulled apart at a speed of 50 mm per minute and the force relative to the adhesion area (N/cm$^2$) at which the strip of adhesive tape has been sheared off is measured. The tensile forces are indicated by arrows.

For the sake of simplicity, the adhesive cement on the upper strip of adhesive tape is not shown at all. Moreover, the adhesive cement is only shown in the adhesion area on the second strip.

Figure 3:
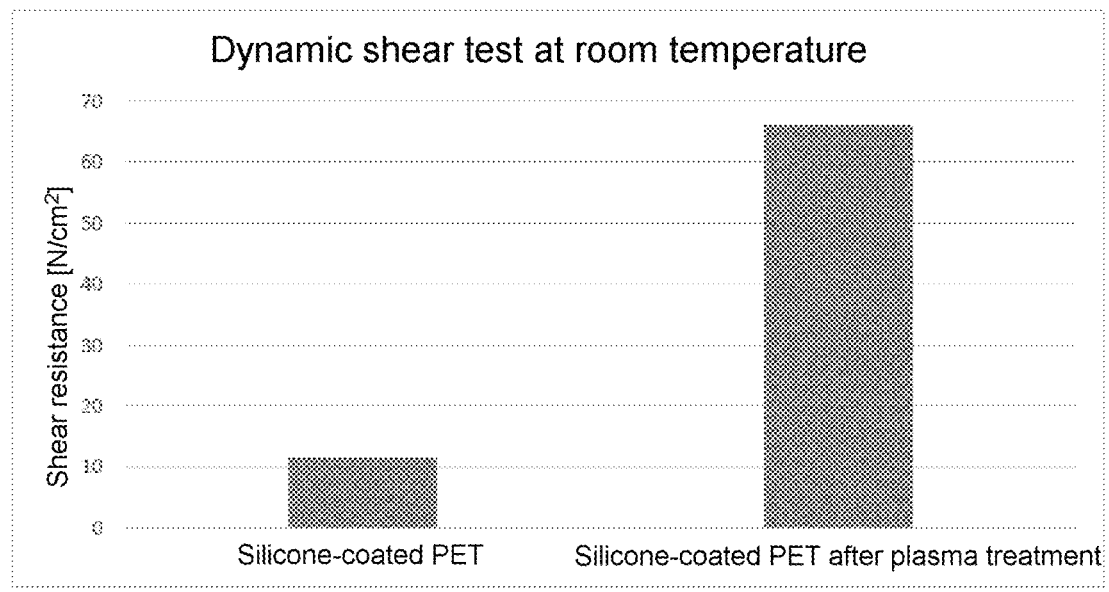
FIG. 3 illustrates the shear resistance increase due to plasma treatment.

A physical surface treatment in the form of a plasma treatment immediately before the adhesive tape is applied to the reverse side of the adhesive tape has the effect of optimizing the adhesion of the surface. In this case, the carrier film is a PET film. The following graph shows that the shear resistance increases clearly and to a surprising degree, by a factor of almost 6, due to the plasma treatment, despite the fact that the reverse side of the adhesive tape has been coated with silicone (see FIG. 3).

Compared with the adhesive tapes which have not undergone plasma treatment of the reverse side, a considerably more reliable attachment in a multilayer bonding arrangement in the form of an adhesive tape winding is created. Even so, the adhesive tape can still be easily unrolled from the adhesive tape roll on which it is supplied in the same way as before.

LIST OF REFERENCE SIGNS

1 Carrier film
2 Adhesive cement layer
3 Separating agent layer

The invention claimed is:

1. Method comprising:
    unrolling from an adhesive tape roll an adhesive tape comprising a carrier, an adhesive cement layer, and a separating agent layer;
    subjecting the separating agent layer to a plasma treatment, thereby forming an unrolled adhesive tape comprising a plasma-treated separating agent layer; and
    winding the unrolled adhesive tape comprising a plasma-treated separating agent layer around a medium which is capable of expanding transversely to a winding so that at least a portion of the unrolled adhesive tape comprising a plasma-treated separating agent layer is bonded to an adhesive cement layer on a lower winding ply,
wherein:
    the carrier film comprises a first side and a second side;
    the adhesive cement layer is disposed on the first side;
    a separating agent layer is disposed on the second side; and
    the plasma treatment comprises use of a process gas selected from the group consisting of air, carbon dioxide, an inert gas, nitrogen, oxygen, and mixtures thereof.

2. Method according to claim 1, wherein the plasma-treated, unrolled adhesive tape is wound onto itself around the medium to form a plurality of winding plies.

3. Method according to claim 1, wherein:
    the adhesive tape comprises at least one filament; and
    the at least one filament increases the tensile strength of the adhesive tape.

4. Method according to claim 1, wherein the separating agent layer comprises a separating agent selected from the group consisting of a surfactant release system based on a long-chain alkyl group, a stearyl sulfosuccinate, a stearyl sulfosuccinamate, a polyvinylstearyl carbamate, a polyethylene imine stearyl carbamide, a chromium-based complex comprising a $C_{14}$-$C_{28}$ fatty acid and a stearyl copolymer, a polymer based on an acrylic polymer comprising a perfluorinated alkyl group, a silicone, and a fluorosilicone compound.

5. Method according to claim 1, wherein the adhesive cement layer comprises an adhesive cement selected from the group consisting of an adhesive cement based on a natural rubber, an adhesive cement based on a synthetic rubber, and a silicone adhesive cement.

6. Method according to claim 1, wherein the process gas further comprises an additional gas-phase substance selected from the group consisting of a siloxane, an acrylic acid, a solvent, hydrogen, an alkane, an alkene, an alkyne, a silane, a silicon-organic monomer, an acrylate monomer, water, an alcohol, a peroxide, and an organic acid.

* * * * *